United States Patent [19]
Gallia et al.

[11] Patent Number: 5,126,973
[45] Date of Patent: Jun. 30, 1992

[54] REDUNDANCY SCHEME FOR ELIMINATING DEFECTS IN A MEMORY DEVICE

[75] Inventors: James D. Gallia, Dallas; Jim Childers, Fort Bend, both of Tex.

[73] Assignee: Texas Instruments Incorporated, Dallas, Tex.

[21] Appl. No.: 479,510

[22] Filed: Feb. 14, 1990

[51] Int. Cl.⁵ .............................................. G11C 7/00
[52] U.S. Cl. ............................. 365/200; 365/230.03; 365/230.06
[58] Field of Search ............ 365/200, 230.03, 230.06; 371/10.3, 11.1, 8

[56] References Cited

U.S. PATENT DOCUMENTS

| | | | |
|---|---|---|---|
| 4,047,163 | 9/1977 | Choate et al. | 371/10.3 |
| 4,604,730 | 8/1986 | Yoshida et al. | 365/200 |
| 4,754,434 | 6/1988 | Wang et al. | 365/200 |

Primary Examiner—Joseph A. Popek
Attorney, Agent, or Firm—Ronald O. Neerings; Lawrence J. Bassuk; Richard L. Donaldson

[57] ABSTRACT

A redundancy scheme for a memory device, as well as a method for developing a redundancy scheme, resulting in improved repairability for given space constraints. A memory device is formed with a plurality of data blocks having individual input/output paths. Each block comprises an array of memory cells arranged in addressable rows and columns along row lines and column lines. The array is configured in sub-blocks each comprising a plurality of the memory cells. The device includes row address circuitry for selecting a row of the memory cells, column address circuitry for selecting a column of the memory cells and address repair circuitry. The address repair circuitry is configurable to render a first portion of a first of the columns of cells responsive to the address of a portion of a second of the columns of cells. There is also provided a method for eliminating a defect in a memory device having a logical data block formed with addressable rows and columns of memory cells. A defect associated with a first column of cells is eliminated by programming a portion of a second column of cells to be responsive to the addresses of a portion of the cells in the first column.

4 Claims, 10 Drawing Sheets

REDUNDANCY SCHEME FOR ELIMINATING DEFECTS IN A MEMORY DEVICE

The present invention relates to semiconductor memory devices and, more particularly, to devices which include repair circuitry for eliminating defects in memory devices.

BACKGROUND OF THE INVENTION

In the fabrication of semiconductor memory devices it is common for an array of memory cells to include one or more defects which prevent the proper performance of the memory circuit. If a type of defect occurs systematically it can often be causally analyzed and designed out. Other defects which are generally not systematic include short circuits between adjacent columns and open circuits within individual columns of memory cells. For analysis purposes the distribution of such defects in a memory device, as well as the distribution of the number of defects among a given production lot, may be considered random so that the yield of good devices in a lot can be modelled according to a Poisson distribution function. Typically, over the period of time that a particular device or family of devices is being produced in a given manufacturing facility the product yield can be improved by removing causes, e.g., particulate matter, of the above-mentioned random defects.

In many fabrication processes the causes of random defects cannot be completely eliminated and it is desirable to further improve the yield of memory devices with redundant circuitry. During testing of a chip defective memory cells can be identified and replaced. Such redundancy techniques are especially suited for semiconductor memories because large numbers of repeating elements are arranged in columns and rows. This array format lends itself to replacement of a defective column or row with any of multiple identical redundant columns or rows.

A redundant circuit scheme may be implemented with a plurality of universal decode circuits connected to the redundant columns. To activate the redundant circuitry appropriate fuses are included for programming individual decoder circuits to be responsive to the addresses of defective memory cells. For example, in dynamic random access memory devices (DRAM's) address integrity can be maintained by simply programming redundant column circuits to respond to defective column addresses. Thus the address of each defective column is assigned to a redundant column circuit. In video and frame memory circuits the replacement procedure may require greater complexity in order to maintain the sequential nature of memory output. See U.S. Pat. No. 4,598,388 assigned to the assignee of the present invention.

Semiconductor memories of all types are being made with progressively higher bit densities and smaller cell sizes as the density of integrated memory circuits increases. In 1972 4K bit DRAMs were being designed while in 1982 one megabit devices were planned. Sixteen megabit device densities will become mass produced during the 1990's. As memory capacity continues to progress there must be further improvement in associated performance parameters such as memory access time. As a result memory architectures, which have already become relatively complex, are likely to become even more elaborate as device densities increase.

In order to improve performance it is now commonplace to partition higher density memory arrays into logical data blocks wherein all cells associated with a particular block have common I/O paths. With this arrangement data blocks in an array can be individually accessed. Accordingly, each data word, e.g., possibly 16 or 32 bits wide in a 64 Megabit device, could be stored entirely within one of the blocks so that the entire word can be retrieved from the memory at a given time. Thus there is no loss in availability of data. Advantageously, the blocks in a partitioned array have shorter signal paths, smaller propagation delays and hence faster access times. Further, since only one of many blocks is accessed at a time, the overall device power consumption is also reduced.

Such partitioning requires that at least some of the support circuitry, which functions to select desired memory locations as well as to sense and maintain data states, be repeated for each data block. When the concept of internally partitioning a memory array into smaller logical data blocks was introduced, the memory densities were lower than now achievable and repetition of support circuitry for each data block was an acceptable cost in view of the above-noted performance benefits. That is, the resulting increase in chip size over that required for a slower, more power consuming array design was not critical.

Now, with the development of even denser memory devices, the requisite reduction in feature sizes renders these circuits susceptible to defects caused by particulate matter which previously caused no problems in the fabrication process. Thus with further improvements in circuit density there will be a greater challenge to eliminate random-type defects. Accordingly, greater reliance may be placed on redundant circuit repair schemes.

In theory, by providing a sufficient number of redundant circuits on a device, all column defects of the type described above would be repairable in order to maximize the yield of a production lot. Practically, however, cost effectiveness usually dictates that space constraints will limit the quantity of redundant circuits to be placed on each integrated circuit. It is undesirable to increase repair circuitry in proportion to memory density.

SUMMARY OF THE INVENTION

In the past redundancy schemes have consisted of only a few extra rows and columns in order to replace up to a predetermined maximum number of defective elements. As long as each logical data block of an internally partitioned memory device included separate address circuitry, the inclusion of sufficient redundant row and column lines within these data blocks did not present difficulties.

Now, due to cost constraints which limit the package size of higher density circuits, it is undesirable to repeat for each memory data block all of the support circuitry needed to replace defective cells. By way of example, redundant column select circuitry need not be repeated for each data block. In fact, it is more space efficient to generate the repair column select signals for all of the data blocks with one series or bank of decoder circuits.

Although sharing of support circuitry among data blocks results in significant saving of space for a circuit layout, it is now recognized that such schemes both complicate and reduce the efficiency of prior art repair techniques.

It is an object of the invention to provide a redundancy scheme which includes a predetermined number of decoder circuits and is more space efficient or more effective than other redundancy schemes having the same number of decoder circuits.

More generally, there is provided a redundancy scheme, as well as a method for developing a redundancy scheme, resulting in improved device repairability for given space constraints. A memory device is formed with a plurality of data blocks having individual input/output paths. Each block comprises an array of memory cells arranged in addressable rows and columns along row lines and column lines. The array is configured in sub-blocks each comprising a plurality of the memory cells. The device includes row address circuitry for selecting a row of the memory cells, column address circuitry for selecting a column of the memory cells and address repair circuitry. The address repair circuitry is configurable to render a first portion of a first of the columns of cells responsive to the address of a portion of a second of the columns of cells.

There is also provided a method for eliminating a defect in a memory device having a logical data block formed with addressable rows and columns of memory cells. A defect associated with a first column of cells is eliminated by programming a portion of a second column of cells to be responsive to the addresses of a portion of the cells in the first column.

In a preferred embodiment of the invention the address repair circuitry includes at least first and second decoders. The first decoder is programmable to render the first portion of the first column of cells responsive to the address of the portion of the second of the columns of cells. The second decoder is programmable to render a second portion of the first column of cells responsive to the address of a portion of a third one of the columns of cells. Alternately the second decoder may be programmed to render a portion of a first of the columns of cells in a second of the data blocks responsive to the address of a portion of a second of the columns of cells in the second data block.

According to one example of the preferred embodiment a memory device is formed with a plurality of logical data blocks each having individual input/output paths. One of the blocks comprises an array of memory cells arranged in rows and columns and configured in sub-blocks. Each sub-block includes a plurality of memory cells arranged in rows and subcolumns. The block also contains row address circuitry for selecting a row of memory cells and column address circuitry for selecting a memory cell in a column which intersects a selected row. A second group of memory cells is arranged in a repair column which includes a repair subcolumn for each sub-block of memory cells in the logical data block. Address repair circuitry is provided for replacing subcolumns in the array with repair subcolumns. The repair circuitry includes a plurality of programmable repair column decoders for selecting a repair subcolumn or a segment of repair subcolumns based on row and column address information.

With this scheme incorporating a level of row decoding in the repair column decoders, portions of redundant columns can be allocated to replace portions of array columns containing defective memory cells. Thus, with multiple decoders, a single redundant column can be utilized to replace multiple defects occuring in different columns.

BRIEF DESCRIPTION OF THE DRAWINGS

The invention may be best understood by reference to the following detailed description of a preferred embodiment when read in conjunction with the accompanying drawing, wherein.

DETAILED DESCRIPTION OF THE INVENTION

Figure 1:
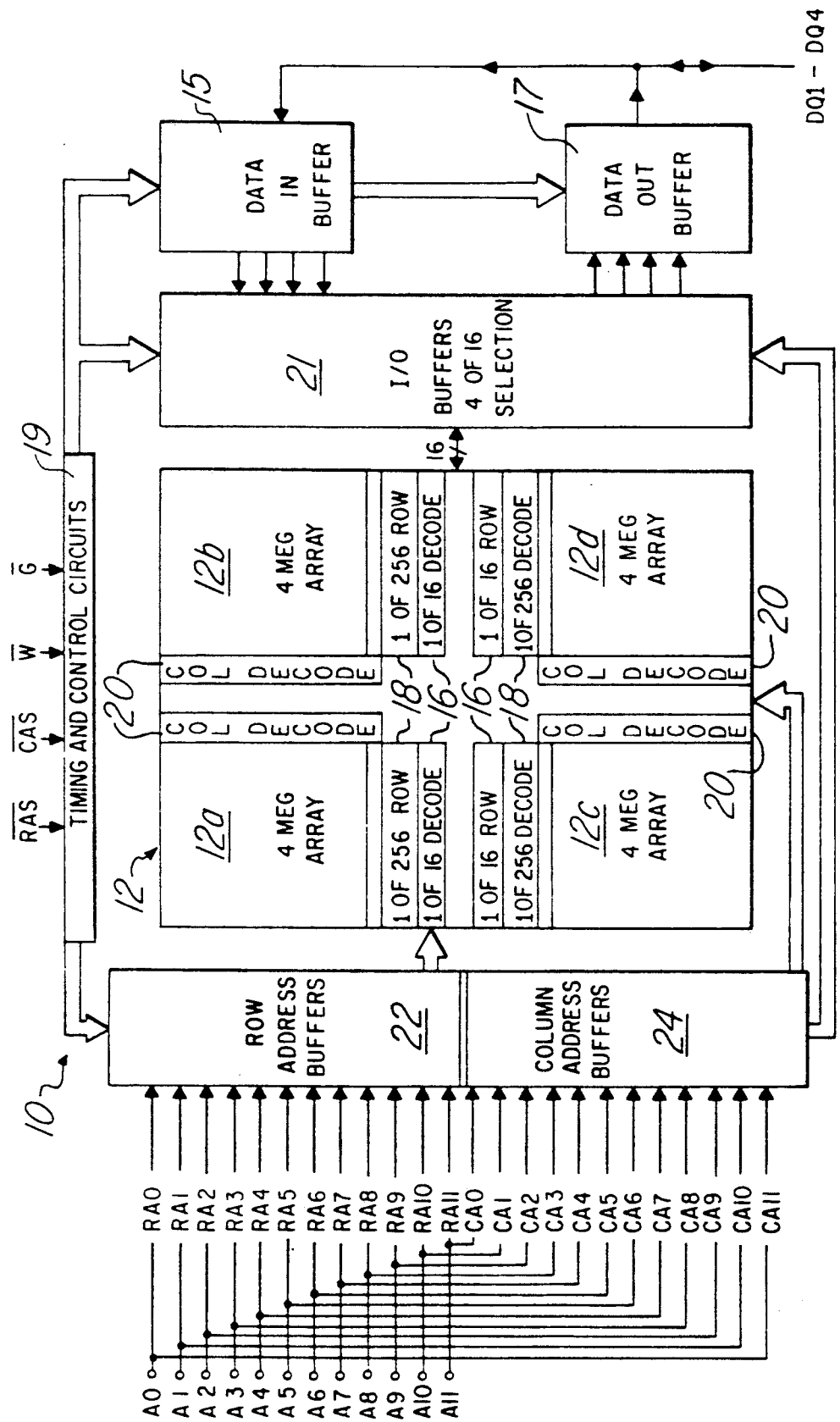
FIG. 1 is a plan view of a memory device which may incorporate the invention.

The block diagram of FIG. 1 illustrates a semiconductor memory device with which the invention may be practiced. This exemplary device 10 is a DRAM of the socalled 16 Megabit size, having an array 12 of $2^{24}$ or 16,777,216 onetransistor storage cells arranged in rows and columns. According to a preferred architecture the array 12 is partitioned into four identical subarrays or blocks, individually designated 12a, 12b, 12c and 12d. Each block 12 is of the four megabit size, comprising 4,194,304 memory cells arranged in an array of 4,096 rows and 1,024 columns C.

Device 10 operates as a standard DRAM part to read and write data bits DQ1-DQ4 into data in buffer 15 and out from data out buffer 17 in response to normal time multiplexed address signals A0-A11 received in ROW address buffers 22 and column address buffers 24 and in response to timing signals including $\overline{RAS}$, $\overline{CAS}$, $\overline{W}$ and $\overline{G}$ received at timing and control circuits 19. Row decoders 16 and 18 and column decoders 20 use the buffered address signals to select the desired memory cells and connect their contents to I/O buffers 21. From there the selected data is read out of data out buffer 17. Writing data occurs in a known similar manner from data in buffer 15, through I/O buffers 21 to the selected memory cells.

Figure 2:
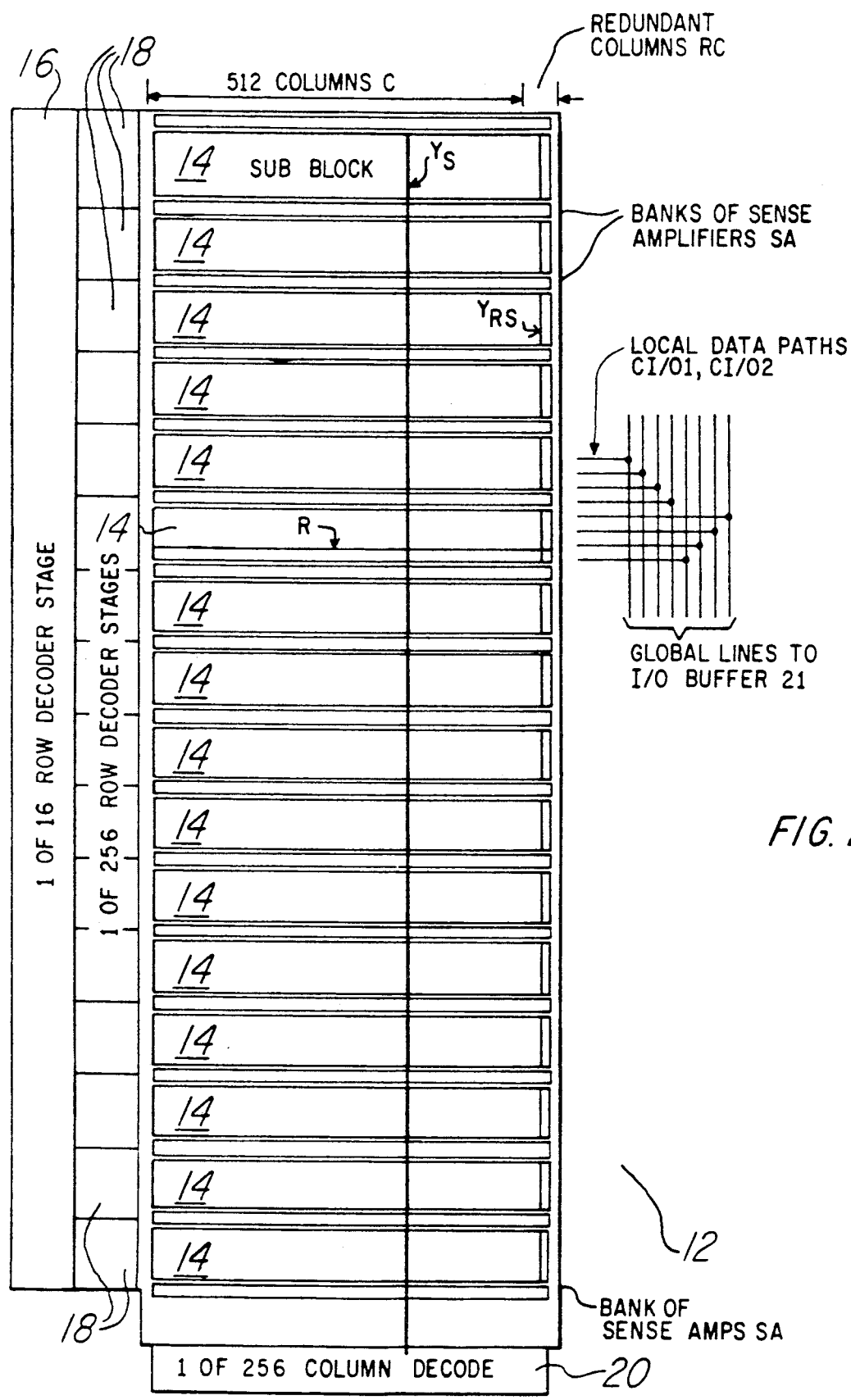
FIG. 2 illustrates the general layout of a logical data block in the device of FIG. 1.
Figure 3:
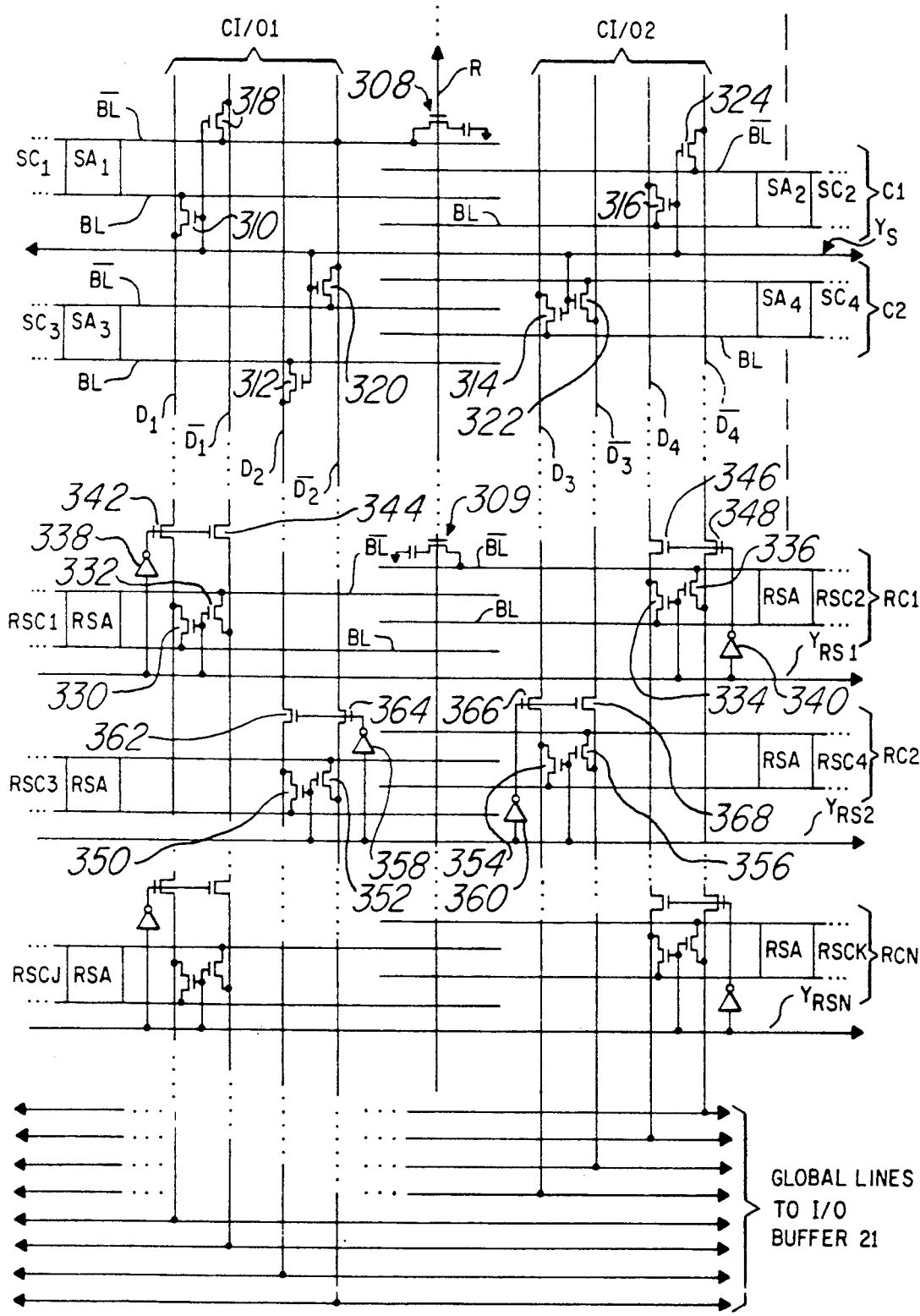
FIG. 3 is a partial view of a sub-block of one of the data blocks.
Figure 4:
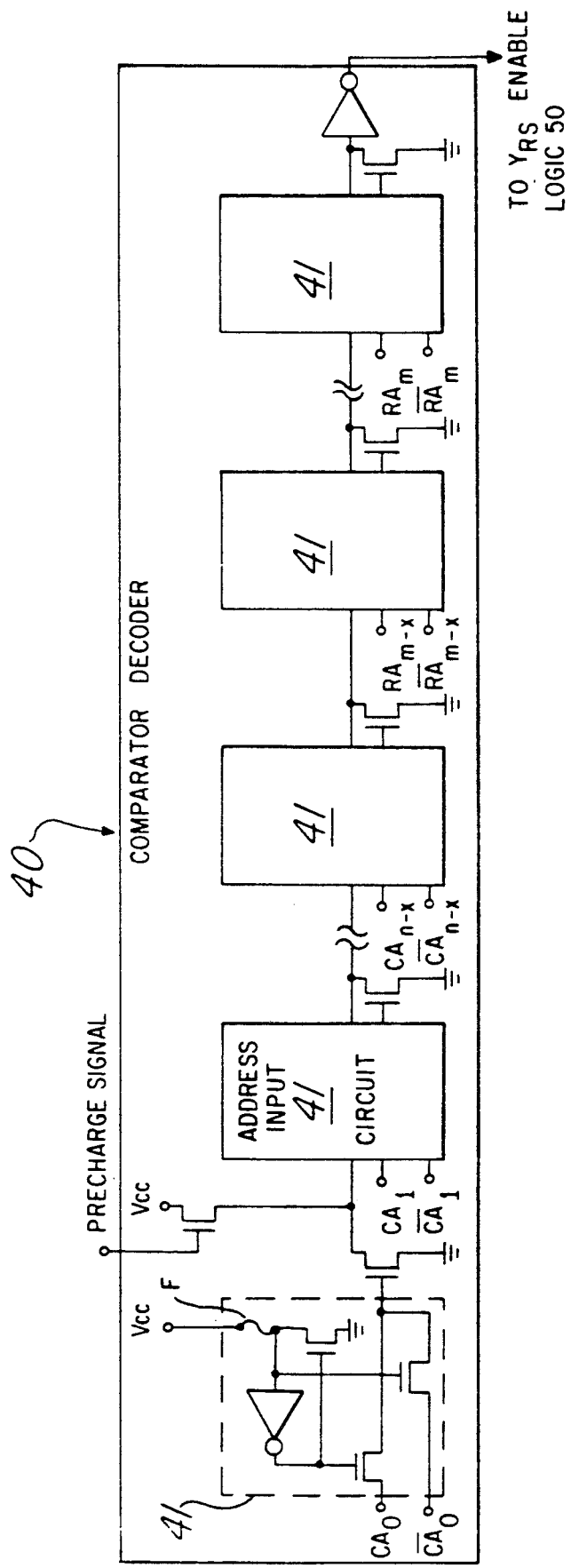
FIG. 4 schematically illustrates a fusible comparator decoder according to the invention.

Circuit details of the device 10 which are helpful to understanding the invention are illustrated in FIGS. 2, 3 and 4. As indicated in FIG. 2 each data block 12 is partitioned into sixteen sub-blocks 14. The portion of a column C within each sub-block 14 is formed as a pair of interdigitated subcolumns SC. See FIG. 3. Thus 1024 pairs of subcolumns are in each sub-block. Banks of sense amplifiers SA border upper and lower opposing sides of each sub-block.

The partial view of FIG. 3 illustrates two adjacent pairs of interdigitated subcolumns SC. The first pair comprises subcolumns $SC_1$ and $SC_2$ and the second pair comprises subcolumns $SC_3$ and $SC_4$. Each of the pairs of subcolumns is associated with one of two adjacent columns $C_1$ and $C_2$ in the sub-block. As is common in high density DRAM devices the subcolumns are arranged in a folded bitline configuration. Thus each subcolumn SC comprises two bitline segments BL and $\overline{BL}$ each connected to memory cells, such as memory cell 308, and connected to the same sense amplifier SA. The two subcolumns within the sub-block 14 that are associated with the same column C are coupled to different sense amplifiers SA on opposing sides of the sub-block 14. Except for the outermost banks of sense amplifiers in the data block 12 (i.e., those situated along the outer sides of the first and last of the sixteen sub-blocks) each bank of sense amplifiers is shared by sub-columns in an adjacent pair of sub-blocks.

Within each sub-block 14 there are 256 row or word lines R and 256 column select lines $Y_S$. For simplicity of illustration only one row line R and one column select line $Y_S$ are shown in FIGS. 2 and 3. A row line is selectable based on row address information input to a one of sixteen row decoder stage 16 and a one of 256 row decoder stage 18 (See FIG. 2). There are 16 of the one of 256 stages 18, one for each sub-block 14. In each data block 12 column address decoders 20 turn on a select line $Y_S$ to control read/write data transfer for two columns.

The four sub-columns in a sub-block that are associated with each select line $Y_S$ are grouped in pairs for independent and parallel data I/O along one of two, 2-bit wide, local data paths $C_{I/O}$. FIG. 3 illustrates two such paths, designated $C_{I/O1}$ and $C_{I/O2}$. Path $C_{I/O1}$ comprises two pairs of data lines $D_1$, $\overline{D_1}$ and $D_2$, $\overline{D_2}$ each pair providing one bit of information. Similarly path $C_{I/O2}$ comprises two pairs of data lines $D_3$, $\overline{D_3}$ and $D_4$, $\overline{D_4}$.

Lines $D_1$, $D_2$, $D_3$ and $D_4$ are connected by transistors 310, 312, 314 and 316 to receive signals from bitline segments BL and lines $\overline{D_1}$, $\overline{D_2}$, $\overline{D_3}$ and $\overline{D_4}$ are connected by transistors 318, 320, 322 and 324 to receive complementary signals from bitline segments $\overline{BL}$. Thus each pair of bitlines, in the four subcolumns of a sub-block that are associated with a particular select line $Y_S$, is paired to one of the data line pairs $D_i$, $\overline{D_i}$. A four-bit wide global data path connects the local paths in each sub-block 14 of a logical data block 12 to the data I/O buffers 21. Thus, when a row of memory cells in a particular sub-block is addressed and a select line $Y_S$ is also addressed, data is simultaneously transfered between four memory cells within two adjacent pairs of sub-columns SC and the I/O buffers 21.

For this exemplary DRAM embodiment the row decoding arrangement enables simultaneous transfer of data to or from one sub-block 14 in each of the four data blocks 12 at a given time. The column select arrangement provides X 4 output from each data block 12. Thus the I/O buffers 21 could provide 16 bit parallel I/O.

During a data transfer operation row address signals RA0 through RA11 and column address signals CA0 through CA11 are input in conventional time-multiplexed manner being latched into row and column address buffers 22 and 24 according to timing signals $\overline{RAS}$ and $\overline{CAS}$. See FIG. 1. Based on 4 bits of row address information RA0 through RA3, the first row decoder stage 16 selects one of the 16 sub-blocks in each of the data blocks 12. The second row decoder stage 18 selects one of the 256 rows within each selected sub-block based on the remaining 8 bits of row address information RA4 through RA11. The decoder circuitry 20 receives eight bits of column address data, A0 through A7, to provide a logic-high signal along one of the 256 select lines $Y_S$ in a data block 12. With this selection the data block provides four bits of data on a pair of 2-bit paths $C_{I/O}$ associated with the accessed sub-block. The next two bits of column address data CA8 and CA9 can be applied in any of several well known decoder circuit arrangements to vary the output of the data block from X 1 to X 4.

The memory array of each data block 12 includes, in addition to the 4,194,304 cells arranged along 1024 columns C, a predetermined number of redundant columns RC. Data I/O of the memory cells such as redundant memory cell 309 in each column RC is controlled by a redundant column select line $Y_{RS}$. One redundant column select line $Y_{RS}$ is illustrated in FIG. 2. In principle, the number of redundant columns RC provided in each data block can be sufficient to maximize the yield of a production lot. On the other hand, given typical space constraints, it is desirable that individual data blocks in the device 10 comprise less than five redundant select lines $Y_{RS}$.

As further illustrated for the sub-block 14 of FIG. 3, the redundant columns RC are formed as pairs of redundant sub-columns RSC and a redundant column select line $Y_{RS}$ is connected to access data from each subcolumn pair. All of the sub-blocks 14 in a data block 12 include the same number of redundant column selects.

Recalling that the four sub-columns SC associated with each select line $Y_S$ in a sub-block 14 are also arranged in pairs, portions of each pair of redundant columns can be wired to replace one or more portions of a pair of subcolumns in a column C. In order to substitute defective memory cells with functioning cells, memory cells in each redundant column are arranged along the 4,096 rows of a data block 12 with each cell connected to a different row line so that all cells in a redundant column can be accessed with the row address decoder stages 16 and 18.

As schematically illustrated in FIG. 3, each redundant select line $Y_{RS}$ enables data transfer between each of two constituent subcolumns RSC in a sub-block and a pair of data lines Di, $\overline{Di}$ associated with each of the paths $C_{I/O1}$ and $C_{I/O2}$. More specifically, a logic-high signal on redundant select $Y_{RS1}$ connects each pair of folded bitline segments in the two selected redundant sub-columns $RSC_1$ and RSC2 to the pairs of data lines D1, $\overline{D1}$ and D4, $\overline{D4}$ through gating transistors 330, 332, 334 and 336. For example, a logic high signal on select line $Y_{RS1}$ will connect the bitline segments of $RCS_1$ to data lines $D_1$ and $\overline{D_1}$ and will connect the bitline segments of $RCS_2$ to data lines $D_4$ and $\overline{D_4}$. During this transfer period all of the sub-columns SC in the sub-block 14 are disconnected from $D_1$, $\overline{D_1}$ and $D_4$, $\overline{D_4}$. This disconnection occurs through action of the outputs of inverters 338 and 340 turning off pass transistors 342, 344, 346 and 348. Similarly a logic high signal on select line $Y_{RS2}$ will connect the bitline segments of RCS3 to data lines $D_2$ and $\overline{D_2}$ and will connect the bitline segments of RCS4 to data lines $D_3$ and $\overline{D_3}$ through gating transistors 350, 352, 354 and 356. The outputs of inverters 358 and 360 disconnect all of the sub-columns SC in the sub-block 14 from $D_2$, $\overline{D_2}$ and $D_3$, $\overline{D_3}$ through gating transistors 362, 364, 366 and 368.

With this arrangement column repair decode circuitry can advantageously incorporate a level of row decoding in order to replace defective sections of columns C with equivalent sections of redundant columns RC. In a simple implementation of this replacement procedure corresponding sections of columns C and redundant columns RC are responsive to the same level of row decoding. For the device 10 a comparator is programmed to replace a subcolumn pair, or a column segment of subcolumn pairs spanning multiple subblocks 14, with a corresponding section of a redundant column.

Such segmentation is useful for allocating two or more portions of the same redundant column for repair of multiple defects occuring in different column segments, e.g., occurring in sections of memory having different column addresses. In the example implementation of the replacement procedure for the device 10, with a given level of row decoding each pair of column sections which is to be replaced must be identifiable with different row address data. When two or more defective sections in different pairs of column sections are identified with the same row address information, a different redundant column RC will be required to replace each of these. Otherwise, as long as sufficient row decoding is provided to associate each of the column sections which is to be replaced with a different section in the repair column, a single redundant column can be segmented to replace all column sections containing the defects in a data block 12. Generally, one redundant column RC can be used to eliminate defects occuring in multiple columns.

The feature of decoding row address information in the column repair circuitry increases the number of repairs which can be made with a given number of redundant columns RC. For example, with a one of fifteen comparator decoder (receiving eight bits of column and three bits of row address information) any one of 8 segments in a redundant column RC can be programmed to replace any one of eight corresponding column segments in any of the four data blocks 12. Alternately, with a one of sixteen comparator decoder (receiving eight bits of column and four bits of row address information) the redundant columns RC can be segmented into sixteen sections each corresponding to a different pair of sub-columns SC in a different one of sixteen sub-blocks 14.

To effect substitution of redundant column cells for defective cells, the column repair decode circuitry includes a plurality of fusible comparator decoders 40. Typically the a decoder 40, shown schematically in FIG. 4, will include a number of input circuits 41 each wired to receive an address signal and its complement. Given n column address signals provided to the address buffers 24 and m row address signals provided to the address buffers 22, the decoder 40 includes n-x input circuits for receiving column address signals and m-y input circuits for receiving row address signals. The value of x corresponds to the number of columns C in a data block 12 and the value of y will depend on the desired level of segmentation. Each address input circuit 41 includes a fuse F for programming the decoder with the row or column address information needed to substitute one segment of memory cells along one redundant select line $Y_{RS}$ in a data block for a defective segment of memory cells in a column C of the same data block.

The number of column repairs which can be made on the entire device 10 is equal in count to the total number of comparator decoders. As illustrated schematically in FIG. 5 the decoders 40 are arranged in segment select groups $SS_i$. Assuming that each data block 12 has the same number of redundant columns RC, all of the decoders 40 in a particular group $SS_i$ are wired to turn on the same redundant select line $Y_{RSi}$ (i=1, N) in all of the data blocks.

For a given level of row decoding in the decoders 40 any one of a predetermined number of sections within a repair column is addressable in the manner described above to replace a defective section along one of the 256 column select lines in any one of the four data blocks. Thus by programming a decoder 40, a section in a redundant column is definable with a combination of row address information to replace a defective section in one of the data blocks. One of four data block select logic 42 presents a second stage of fusible decoders for identifying the data block to which each decoder 40 is to be dedicated.

All of the second stage decoders in the logic block 42 include input circuits 41, like those of the decoders 40, receiving column address bits CA10 and CA11 to effect the one of four selection. Of course, in other redundancy schemes the decoders of block 42 could provide a higher level of selection in order to allocate sections of the redundant columns RC to portions of the data blocks 12. For example, different redundant columns could be assigned to each half of each data block with the decoders in each group $SS_i$ wired to turn on the same redundant select line $Y_{RS}$ in each data half block. With this partitioning the second stage of decoders 42 would include fusible circuits for dedicating each decoder 40 within each group $SS_i$ to a particular half block.

Figure 5:
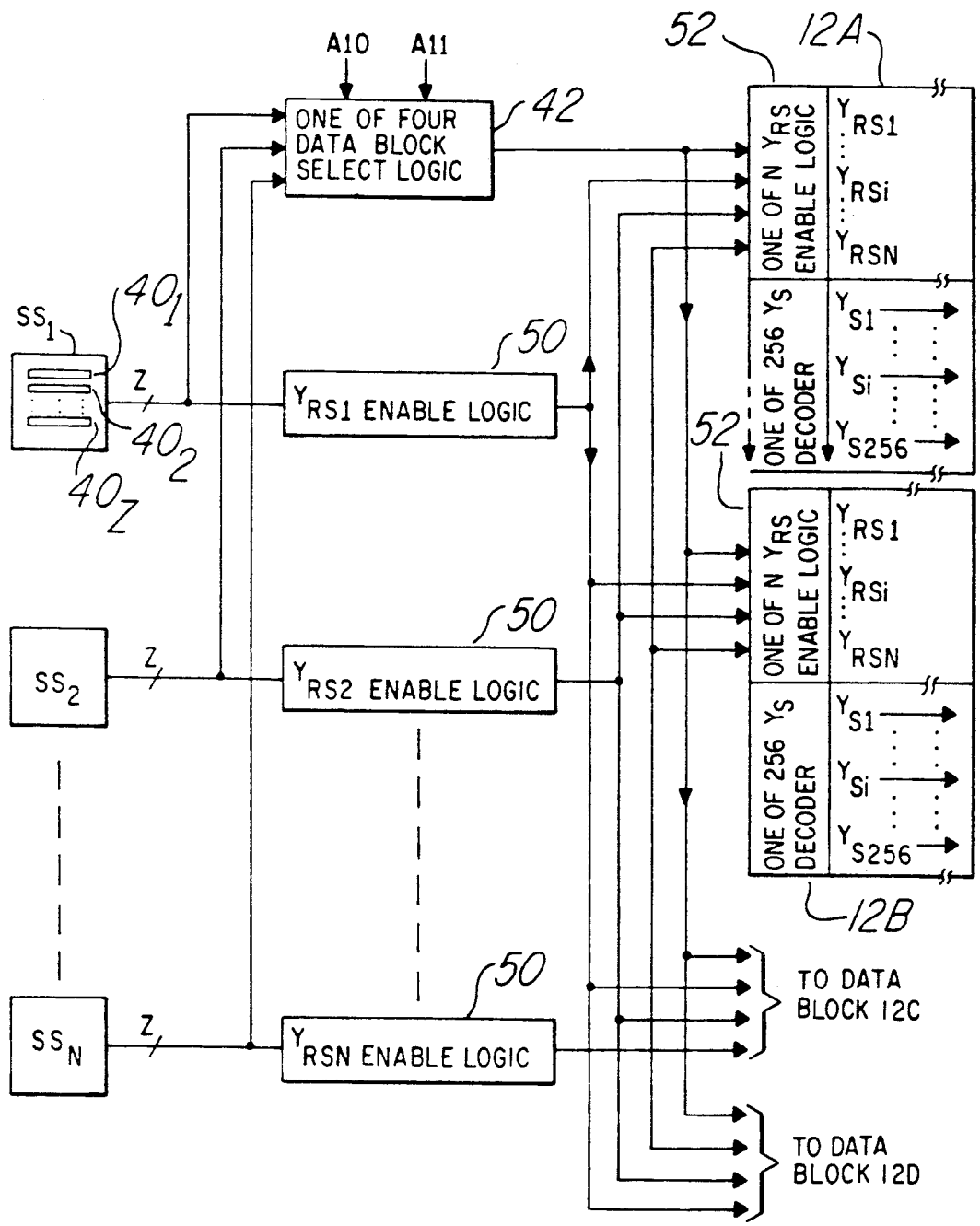
FIG. 5 illustrates in block diagram form a column repair scheme according to the invention.

In the present embodiment the second stage of decoders 42 provides a one of four selection and the number of segment select groups $SS_i$ (i=1 to N) in FIG. 5 is equal to the number, N, of redundant select lines $Y_{RS}$ in each data block 12. The outputs of all the decoders 40 in each segment select group $SS_i$ are input to one of N select enable logic circuits 50. When one decoder in a group $SS_i$ outputs a logic high signal the select enable logic circuit 50 for that group outputs a logic high signal corresponding to the associated redundant select line $Y_{RSi}$. With appropriate addressing provided to the decoders 40 and 42, each select enable logic circuit 50 provides a logic-high signal to one redundant select line $Y_{RS}$ in each data block. FIG. 5 illustrates for two of the data blocks 12A and 12B combinatorial logic 52 for turning on one of N redundant select lines $Y_{RS}$ based on the output of the data block select logic 42 and the enable logic circuits 50.

According to the invention the repairability of a device containing a given number of random defects can be improved by increasing: the aggregate sum of redundant columns; the quantity of decoders to be provided for each redundant column; and the number of sections into which a column C is to be segmented for individual addressing. Commensurate with an increase in the number of sections into which a redundant column C is addressable for effecting repair of one or more columns C, a higher level of repair can be achieved with fewer redundant columns. Thus the likelihood of device repairability will be improved by increasing the level of decoding as well as the number of decoders associated with each redundant column select line $Y_{RS}$.

FIGS. 6A through 6E portray an analysis and methodology for improving the level of defect repair for one data block 12 of the device 10. Given a fixed pattern of five defects each figure depicts an exemplary number of individually addressable sections into which a column C can be segmented to effect replacement with a redundant column RC. For simplicity it is assumed that each defect occurs along a different column select line $Y_S$ and in a different one of sixteen sub-blocks 14. For each of the five examples illustrated in FIGS. 6, as many as five redundant select lines $Y_{RS}$ are available to effect repairs.

When no row decoding is incorporated in each comparator decoders (FIG. 6A) the number of decoders in each segment select group $SS_i$ degenerates to one decoder per redundant select line $Y_{RS}$. When the comparator decoders include no row decode circuitry the columns C cannot be segmented into subsections for individual replacement. Therefore all five redundant select lines must be allocated for repair of the five column defects.

When one bit of row decoding is performed by the comparator decoders (FIG. 6B) the columns can be segmented in two sections (each section covering eight of the sub-blocks 14) and the segment select groups $SS_i$ can include a maximum of two decoders per select line. Full repair is implemented with four select lines $Y_{RS}$ and five decoders. When the comparator decoders perform two bits of row decoding (FIG. 6C) the columns are segmented into four sections (each section covering four of the sub-blocks 14) and the segment select groups $SS_i$ each include up to three decoders. With the scheme of FIG. 6C three select lines $Y_{RS}$ and five decoders will effect full repair of the data block 12.

Figure 6A:
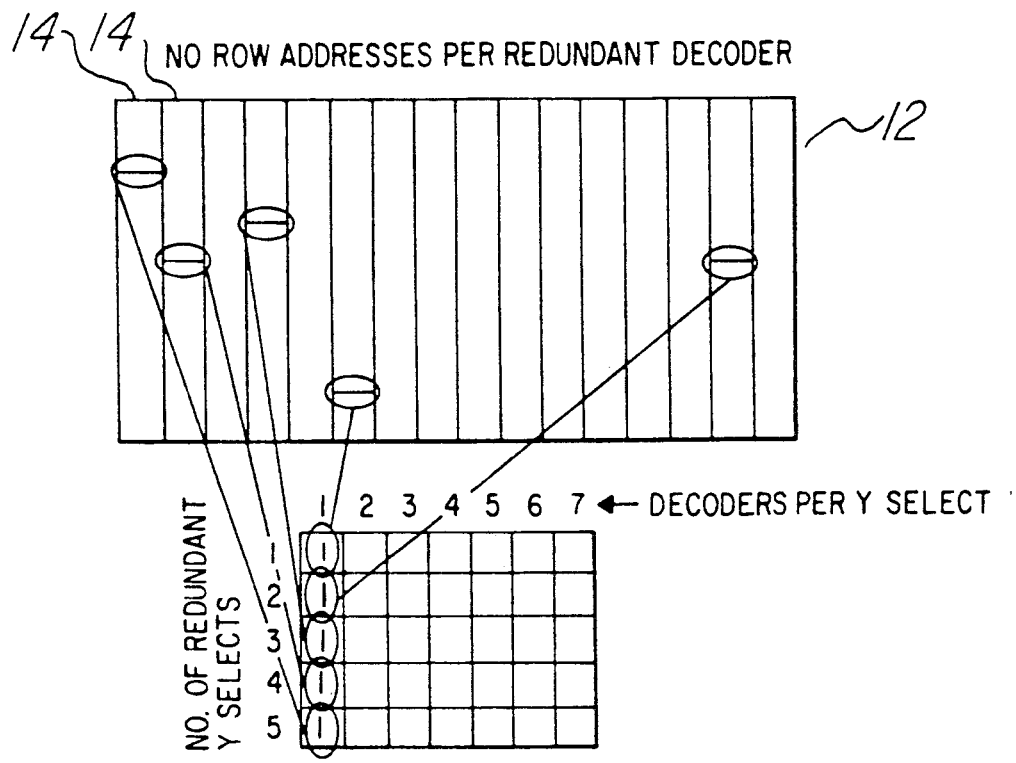
FIGS. 6A through 6E portray an analysis and methodolgy for improving the achievable level of column repair for a logical data block.
Figure 6B:
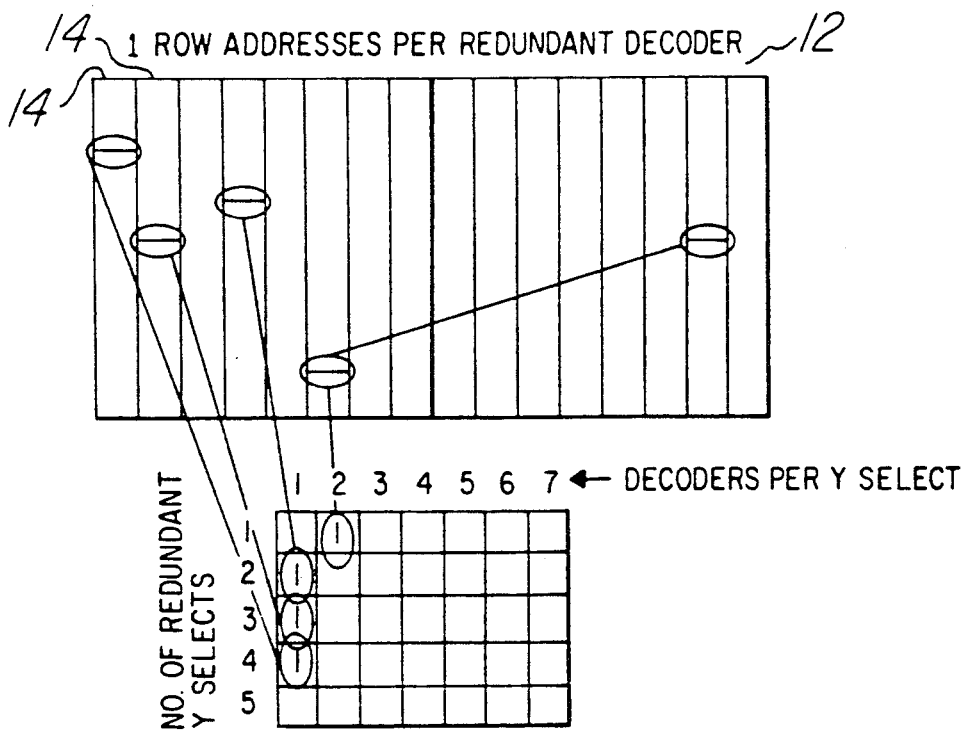
Figure 6C:
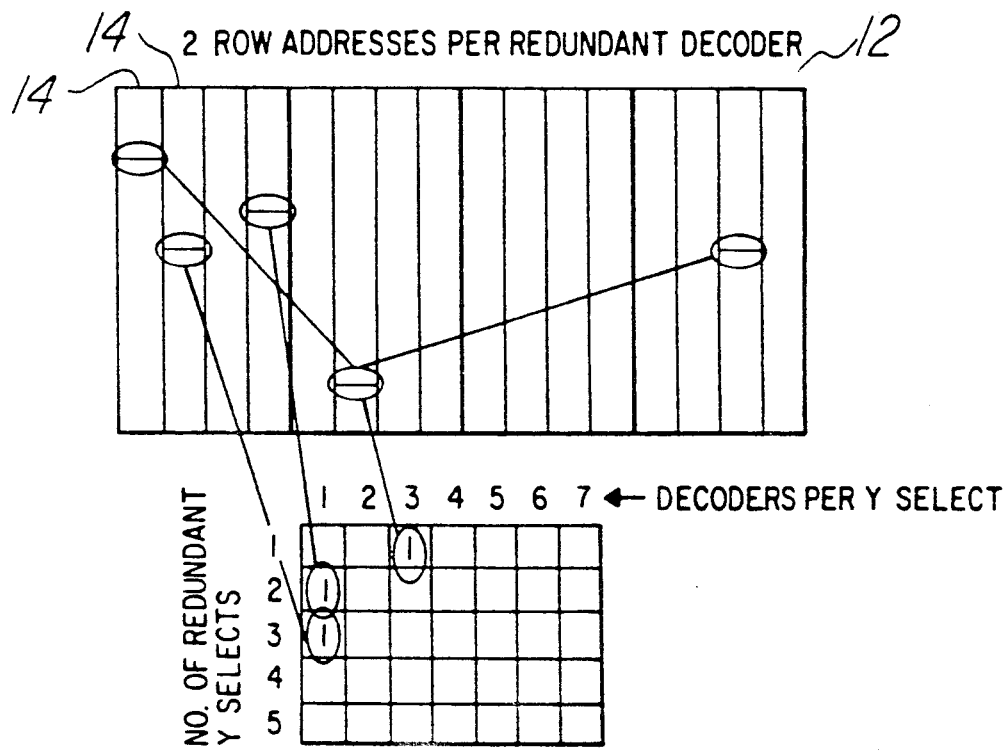
Figure 6D:
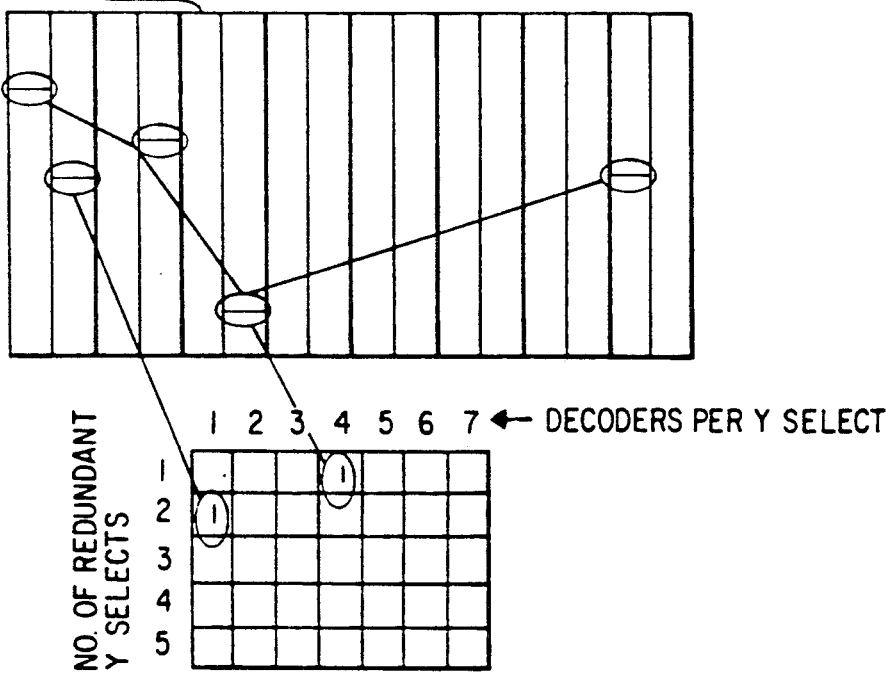
Figure 6E:
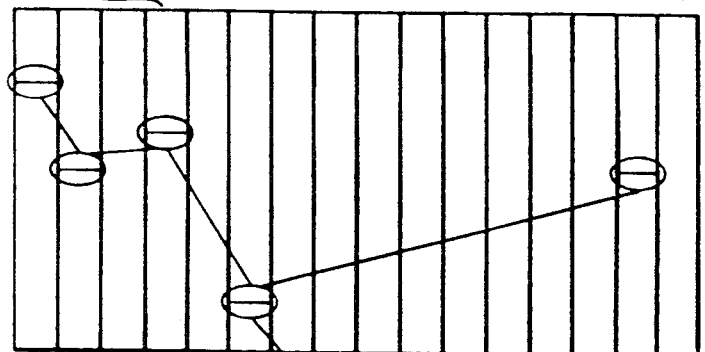
Figure 6E:
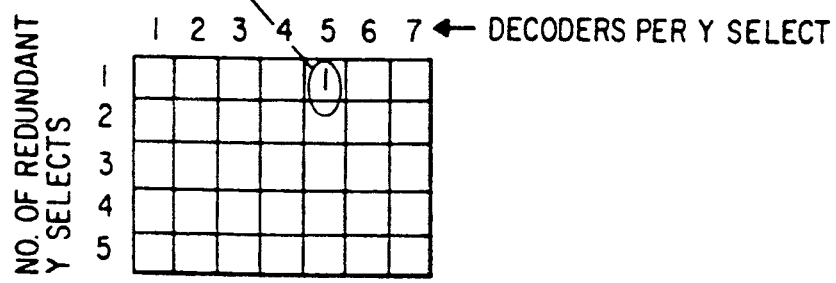

Provision of three row address bits to the comparator decoders segments the columns into eight sections (FIG. 6D) and permits four decoders per select line $Y_{RS}$. Repair of all five defects will be realized with only two select lines $Y_{RS}$ wherein at least one segment select group $SS_i$ includes four decoders. Ultimately, as shown in FIG. 6E, the comparator decoders can resolve the columns into sixteen sections (each corresponding to one sub-block 14) with four bits of row address information. When one segment select group includes five comparator decoders all five repairs can be performed with one select line $Y_{RS}$.

Given a fixed number of redundant select lines $Y_{RS}$ the level of repairability for the entire device 10 can increase when both the count of comparator decoders 40 in all of the sigment select groups increases and the level of row decoding in the comparaator decoders increases. FIGS. 7A through 7F illustrate trends in probability of complete repair for various device defect levels as the level of row decoding in the comparator decoders increases from zero to four bits. The numbers in brackets, e.g., [2] [2], above each graph indicate the number of decoders 40 assigned to each segment select group $SS_i$. A bracketed number is provided for each segment select group.

Figure 7A:
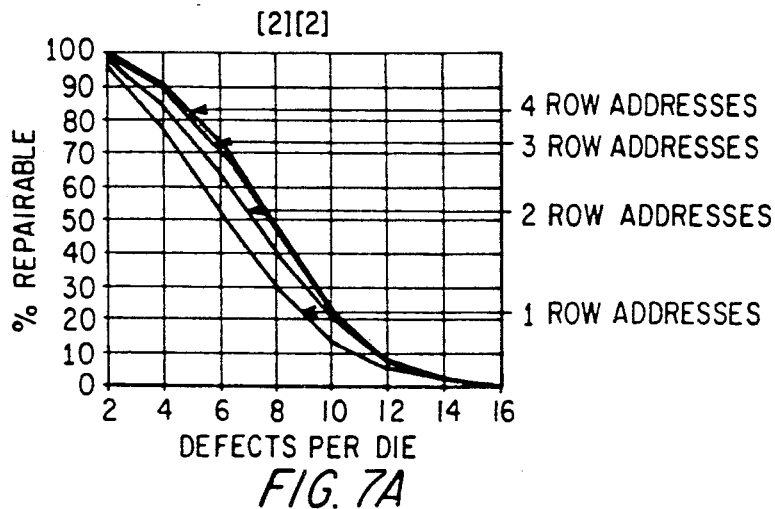
FIGS. 7A through 7F illustrate statistical trends relating to device repairability according to the invention.
Figure 7B:
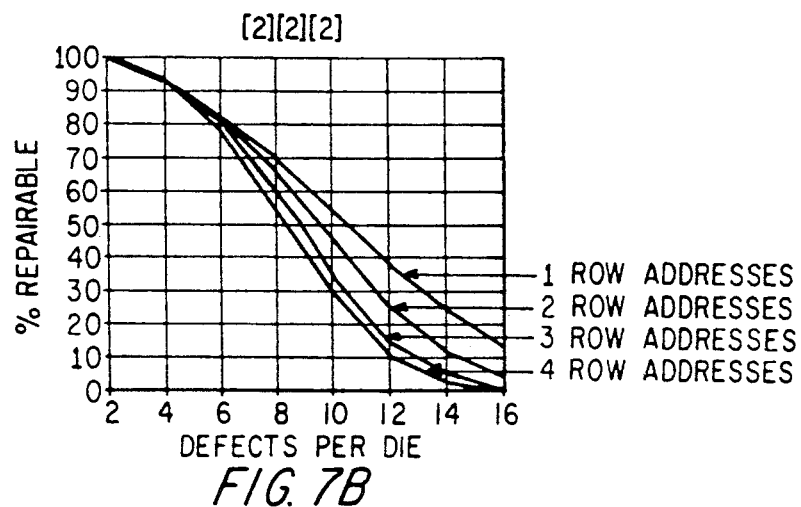
Figure 7C:
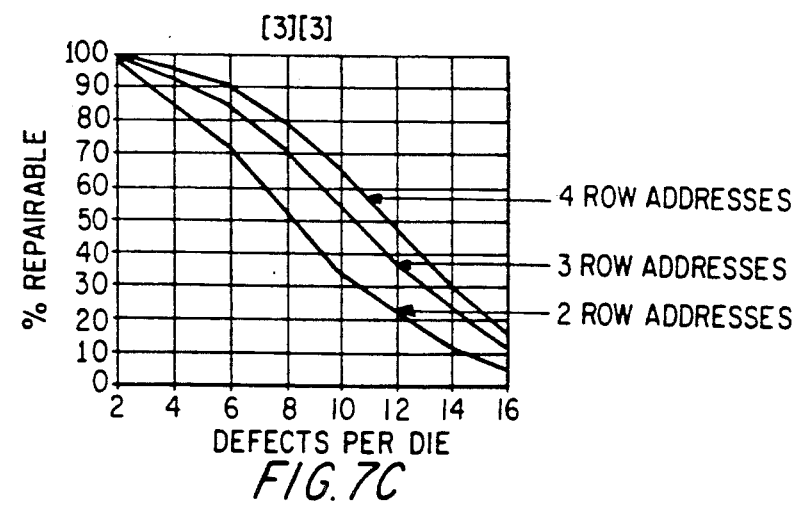
Figure 7D:
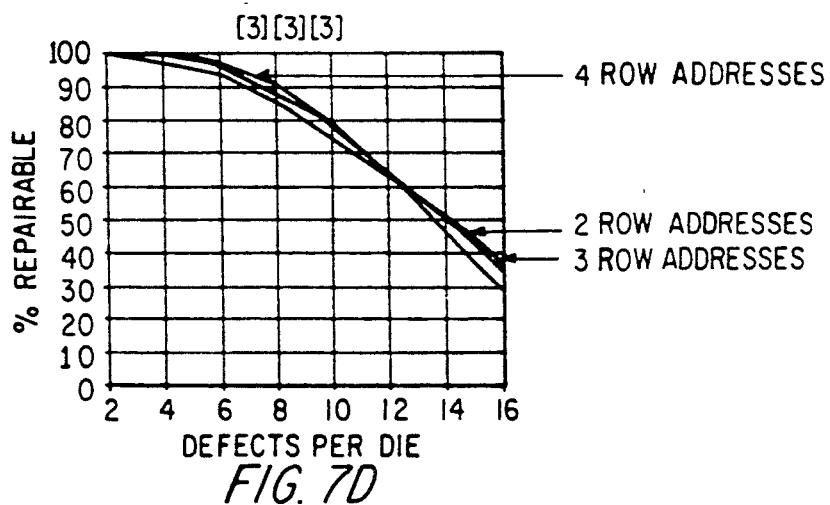
Figure 7E:
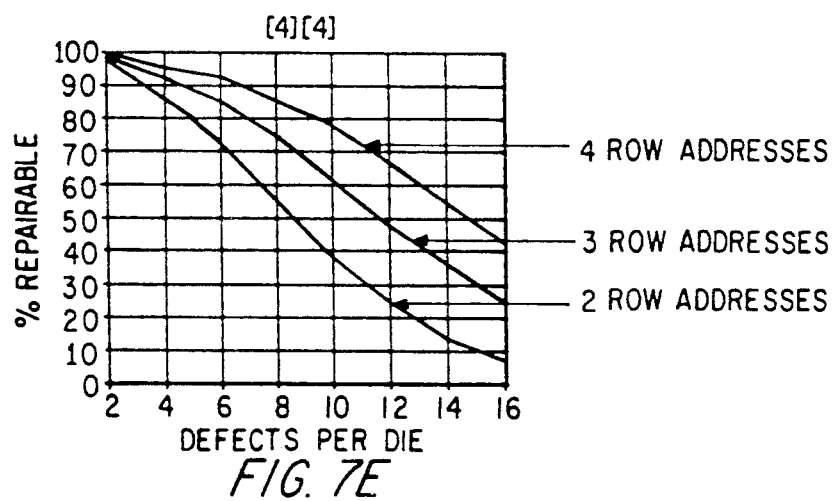
Figure 7F:
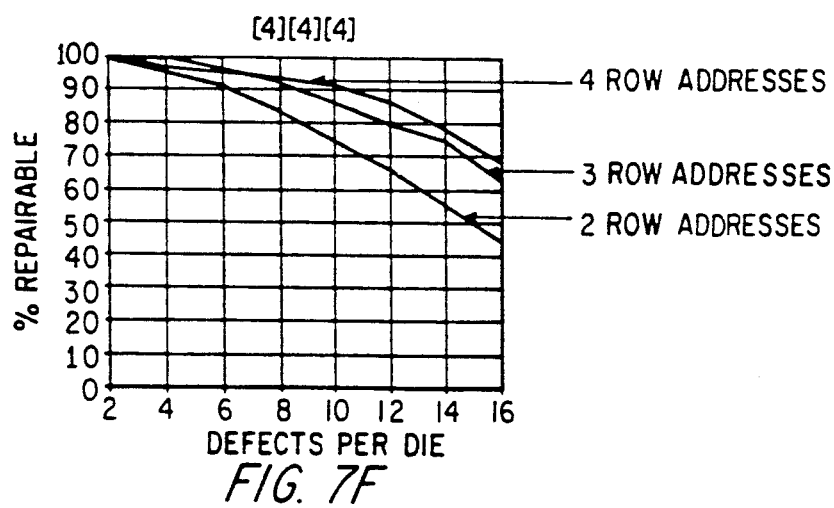

Thus FIG. 7A illustrates improvements in repairability (as a function of row address inputs to the decoders 40) for an embodiment having two segment select groups and two decoders 40 per segment select group. FIG. 7B suggests that for the embodiment of three segment select groups, each including two decoders 40, repairability may not improve with a higher degree of segmentation. FIGS. 7D through 7F indicate improved repairability with higher levels of segmentation. The figures illustrate that repairability according to the invention is dependent on device architecture and improvements may not always be obtained. Comparison of FIGS. 7A, 7D and 7F suggests that device repairability improves as the number of decoders 40 per segment select group and the level of decoding both increase.

The data of FIGS. 6 and 7 are, of course, specific to the exemplary device as well as the defect level. In the same manner inferences can be drawn from analysis of other device designs to identify trends in device repairability. With reference to FIG. 5 and in view of this data, one general approach for implementing a column repair scheme is to provide each segment select group $SS_i$ with the same number, Z, of decoders 40, and to incorporate a sufficient level of row decoding in each decoder 40 to achieve a satisfactory level of repairability.

For the simple example of FIGS. 6 a repair scheme for the entire device could comprise two redundant select lines $Y_{RS}$ each coupled to a different one of two segment select groups $SS_i$. The groups $SS_i$ would comprise four decoders 40 with all of the decoders receiving four bits of row address information to segment each redundant column into sixteen sections. A satisfactory level of repairability may be achievable with other combinations, e.g., three decoders per segment select group $SS_i$ with each decoder receiving three bits of row address information.

The selection of two different repair schemes which exhibit comparable levels of repairability may be based in part on space constraints. The determination of an acceptable level of repair should be made in view of yield projections as well as space constraints to avoid over design. When space constraints and other economies are not critical factors the device can simply incorporate a sufficient number of decoders uniformly distributed among the segment select groups to assure ample repairability.

ADVANTAGES AND MODIFICATIONS

From the above description it can be seen that a method of maximizing repair efficiency with a given number of redundant select lines in each data block involves assigning multiple decoders to each of the redundant select lines so that each line is capable of replacing multiple defective column portions with redundant column portions that are coupled to the same select line.

The definitions of rows, row lines, columns, sub-columns and select lines as used to describe certain embodiments of the invention are not to be construed as limiting the invention. Rather, it is recognized that the many possible variations in device architecture will alter the meanings of these and other terms. Further, the exemplary application of the inventive concepts to what is commonly referred to as column repair does not limit the invention to such. As an example, for various device types, e.g., SRAMs, as well as for simpler device architectures, redundant row repair schemes could include the feature of incorporating column address information in the decoder repair circuitry to replace sections of rows of memory cells containing defects with sections of redundant rows. Thus in defining the invention the meanings of the terms column and row as used in this detailed description and the claims which follow are not limited based on geometric orientation or electrical connection and, unless otherwise restricted, the meanings of these terms are interchangeable.

In describing the feature of decoding row address information in the column repair circuitry the terms section, portion and segment as used herein with regard to a column C or a redundant column RC, each comprehend less than a full column of memory cells and fewer than all of the memory cells connected along one column select line. When interchanging the meanings of the terms row and column the terms section, portion and segment define less than a full row of memory cells or fewer than all of the memory cells along a particular row line.

With consideration to the space constraints present on high density, e.g., sixteen Megabit, devices, redundancy schemes can be optimized for space efficiency as well as repairability. The desirability of minimizing the geometric size of a redundancy scheme stems from the space consuming nature of fuses which are used to program the decoders 40. Even though portions of device circuitry are based on submicron line widths, fuse lines for redundant decoders are significantly wider, e.g., one to two microns on center. Further, to avoid electrical shorts between fuses, as well as between fuse lines and adjacent circuitry, layouts have spaced fuse lines seven microns on center from adjacent fuse lines or other conductors. Thus the space requirement for fusible decoders can be substantial and will increase in direct relation to the level of decoding incorporated to replace defective column sections with corresponding sections of redundant columns.

For these reasons it may be undesirable to repeat for each logical data block all of the all of the programmable support circuitry, e.g., the decoders 40, needed to replace defective cells. Indeed, it has been illustrated that the sharing of redundant column select signals among the data blocks provides economies in the device layout. On the other hand, this sharing complicates the redundancy schemes and so reduces the efficiency of repair that, overall, a larger number of redundant columns may be needed to offset the loss in efficiency of repair. That is, when the redundant column decode circuits are each common to all of the data blocks, at least one column in each data block will share the same select line signal. Segmentation of repair lines overcomes this disadvantage.

In a simple embodiment of the invention, when a defective section in one data block is to be replaced with a redundant section, corresponding sections in the other data blocks could also be replaced by redundant sections that are coupled to the same decoder. Thus replacement of a column section along one data block could require replacement of all corresponding column sections in the other data blocks. More certainly, when a redundant column section in each of several different data blocks shares a common redundant decoder, the assignment of one of those redundant column sections to a specific address constrains assignment of the other redundant column sections in the other data blocks to the same address. With this address dedication scheme the usefulness of a redundant column section in a particular data block which could otherwise be used to replace a defective column section may appear lost.

In redundancy schemes wherein redundant column decoders are shared among several data blocks, the efficiency of column repair can be further improved upon by incorporating additional information within the comparator decoders, e.g., data block designation, to further define where a defect is located and dedicate a portion of only one redundant column each time a decoder is programmed. With this approach a segment of a redundant column will not be used to replace a good segment of a column C. Rather, an addressed segment of a redundant column will be activated only when the corresponding defective segment of a single column, i.e., in only one data block, is addressed.

To implement this feature in the device 10 the comparator decoders 40 of FIGS. 4 and 5 would include additional fusing and address inputs in order to respond to two bits of data block address information (CA10, CA11). With such modification repair segments located in different data blocks, comprising redundant sub-columns connected to the same select line $Y_{RS}$ and identifiable with the same row address information, can be assigned different column address information so that each may be used to replace a defective column portion having a different column address, i.e., A0 through A7.

While the invention has been shown and described with reference to a particular memory device and specific embodiments of repair schemes, it will be understood by those skilled in the art that many changes in design and detail may be made without departing from the spirit and scope of the invention which is limited only by the claims which follow.

We Claim:

1. A memory device formed with a plurality of data blocks having individual input/output paths, each block comprising an array of memory cells arranged in addressable rows and columns along row lines and column lines and configured in sub-blocks each comprising a plurality of memory cells, said device further including:
    row circuitry for selecting a row of the memory cells based on row address information;
    column circuitry for selecting a column of the memory cells based on column address information; and
    address repair circuitry for rendering a first portion of a first of the columns of cells responsive to the addres of a portion of a second of the columns of cells.

2. The device of claim 1 wherein the address repair circuitry includes:
    a first programmable decoder for rendering the first portion of the first column of cells responsive to the address of the portion of the second of the columns of cells; and
    a second programmable decoder for rendering a second portion of the first column of cells responsive to the address of a portion of a third one of the columns of cells.

3. The device of claim 1 wherein the first and second columns are in a first of the data blocks and the address repair circuitry includes:
    a first programmable decoder for rendering the first portion of the first column of cells responsive to the address of a portion of a second of the columns of cells; and
    a second programmable decoder for rendering a first portion of a first of the columns of cells in a second of the data blocks responsive to the address of a portion of a second of the columns of cells in the second data block.

4. A method for eliminating a defect associated with a first column of memory cells in a memory device having a logical data block formed with addressable rows and columns of memory cells, said cells coupled to a plurality of data paths for transferring information between the memory cells and output terminals of the device, said method comprising the step of:
    programming a portion of a second column of cells to be responsive to the addresses of a portion of the cells in the first column.

* * * * *